(12) United States Patent
Takata et al.

(10) Patent No.: US 6,448,658 B2
(45) Date of Patent: Sep. 10, 2002

(54) SEMICONDUCTOR DEVICE HAVING IMPROVED INTERCONNECTION-WIRING STRUCTURES

(75) Inventors: Yoshifumi Takata; Shigeru Harada; Hiroki Takewaka, all of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/757,579

(22) Filed: Jan. 11, 2001

(30) Foreign Application Priority Data

Jun. 15, 2000 (JP) ......................................... 2000-179519

(51) Int. Cl.[7] .......................... H01L 23/48; H01L 23/52; H01L 29/40
(52) U.S. Cl. .......................... 257/774; 257/306; 257/758
(58) Field of Search ................................. 257/758, 288, 257/306, 774; 438/622

(56) References Cited

U.S. PATENT DOCUMENTS 5,929,524 A * 7/1999 Drynan et al. ............... 257/758
6,184,584 B1 * 2/2001 Sakao ........................ 257/758
6,255,685 B1 * 7/2001 Kuroda ....................... 257/306

FOREIGN PATENT DOCUMENTS

| JP | 2-45934 | 2/1990 |
| JP | 7-288244 | 10/1995 |
| JP | 8-250590 | 9/1996 |
| JP | 9-167797 | 6/1997 |

* cited by examiner

*Primary Examiner*—Hoai Ho
*Assistant Examiner*—Tu-Tu Ho
(74) *Attorney, Agent, or Firm*—McDermott, Will & Emery

(57) ABSTRACT

A fourth and a fifth interlayer insulating film are formed and a connecting hole which passes through these films is formed. The connecting hole is filled with a metallic plug. The exposed surface of the fifth interlayer insulating film and metallic plug is etched back by dry etching in an atmosphere containing $CF_4$ gas. Thus, the step difference between the surfaces of the metallic plug and fifth interlayer insulating film is reduced. The shape of the connecting hole is shaped so that its opening has a larger diameter at its upper position. The surfaces of the fifth interlayer insulating film and metallic plug are exposed to plasma atmosphere containing oxygen, irradiated with the light having a wavelength of several 10 nm to 400 nm or subjected to the sputter etching using an Ar gas.

6 Claims, 8 Drawing Sheets

SEMICONDUCTOR DEVICE HAVING IMPROVED INTERCONNECTION-WIRING STRUCTURES

BACKGROUND OF THE INVENTION

The present invention relates to a semiconductor device and a method of manufacturing it, and more particularly to a semiconductor device with an electrode of conductor embedded within a connecting hole formed in an insulating film formed on a semiconductor substrate and method of manufacturing it.

With development of high-integration of a semiconductor device, the width of an internal wiring and size of a connecting hole of the semiconductor device has been reduced. Conventionally, in order to connect an upper wiring and a lower wiring or a semiconductor substrate electrically through a minute connecting hole, a plug technique in which a metallic film is selectively formed within the connecting hole has been generally adopted. Since the metallic film formed by the sputtering is difficult to provide sufficient coating, in the plug technique, the refractory metallic film of e.g. W formed by the CVD technique is etched back to form a metallic film within the connecting hole.

Now, referring to FIGS. 14 to 18, an explanation will be given of a semiconductor device and its manufacturing method using the above plug technique.

First, as shown in FIG. 14, on a semiconductor substrate 51 formed are an oxide film 52 for element isolation, a gate electrode 53 and source/drain regions 54a–54e of a transistor and a first interlayer insulating film 55. A first connecting hole 56 passing through the source/drain region 54b is formed in the first interlayer insulating film 55. Thereafter, a metallic film is formed on the surface of the first interlayer insulating film 55 and embedded within the interior of the first connecting hole 56. The metallic film is subjected to photolithography and etching treatment to form a first wiring layer 57.

As shown in FIG. 15, after a second interlayer insulating film 58 is formed to cover the first wiring layer 57, a second connecting hole 59 is formed which passes through the second interlayer insulating film 58 to reach the source/drain regions 54a and 54c. The entire surface is coated with a polysilicon layer which is in turn subjected to the photolithography and etching treatment to form a charge storage node (hereinafter referred to "storage node") 60. A third insulating film 61 is formed on the entire surface so that it is thin, and is coated with a polysilicon layer again which is subjected to the photolithography and etching treatment to form an upper electrode 62 for charge storage (hereinafter referred to as "cell plate"). The storage node 60, third insulating film 61 and cell plate 62 constitute a capacitor element. The quantity of storable charges is proportional to the surface area of the storage node 60 and inversely proportional to the film thickness of the third insulating film 61. However, since a finer element leads to a smaller size of the storage node 60, generally, contrivance such as low-profiling the third insulating film 61 and greatly changing the height of the storage node 60 is made to assure the quantity of storable charges.

Referring to FIG. 16, after a fourth interlayer insulating film 63 and a fifth interlayer insulating film 64 are formed so as to cover the cell plate 62, a third connecting hole 65 is formed which passes through the fifth interlayer film 64, fourth interlayer insulating film 63, second interlayer insulating film 58 and first interlayer insulating film 55 in a peripheral circuit area to reach the source/drain region 54d, 54e of the transistor.

In this case, since the storage node 60 is formed in a memory cell area, a large surface step or level difference is formed between the memory cell region and the peripheral circuit region. The surface step that is greater than the focusing depth in the photolithography may lead to poor resolution of a resist pattern.

In addition, the etch back treatment of the metallic film may generate the remainder of the refractory metal at the step which is a cause of electrical short-circuiting.

In order to relax such a problem which becomes serious with an increase in the height of the storage node 60, the fourth interlayer insulating film 63 is generally subjected to a flattening technique using BPSG (Boro-Phospho Silicate Glass).

The BPSG film is softened at a high temperature of 800° C. or higher to provide a smooth flow shape in the surface, thereby reducing the surface step. The flatness depends on the concentration of B (boron) or P (phosphorus) and becomes more excellent with an increase in the concentration. As the case may be, the surface of the fourth interlayer insulating film 63 is polished by the CMP (Chemical-Mechanical-Polishing) to improve the flatness of the surface.

Referring to FIG. 17, a first refractory metallic layer 66 and a second refractory metallic layer 67 are formed so as to cover the interior of the third connecting hole 65 and the surface of the fifth interlayer insulating film 64. The first refractory metallic layer 66 and second refractory metallic layer 67 maybe made of generally Ti, W or its nitride, silicide, etc. Further, the first refractory metallic layer 66 and second refractory metallic layer 67 on the fifth interlayer insulating film 64 are etched away to form a metallic plug 68 composed of the first refractory metallic layer 66 and the second refractory metallic layer 67 only within the third connecting hole 65.

Thereafter, a metallic film 69, made of an aluminum alloy such as AlSi, AlSiCu, AlCu, etc. and an antireflective film 70 are formed so as to cover the fifth interlayer insulating film 64 and the metallic plug 68. They are subjected to the photolithography and etching treatment to form a second wiring layer 71. The aluminum alloy, which has a high surface reflection coefficient, is difficult to form a resist pattern through the photolithography. For this reason, the antireflective film 70 is formed on the metallic film 69. The antireflective film 70 may be a refractory metallic film made of TiN, Wsi, MoSi, TiW and W, etc. or their compound. The antireflective film 70 serves to reduce the surface reflection coefficient of the aluminum alloy and improve the reliability by reinforcement of the mechanical strength.

FIG. 18 is an enlarged view of an area "A" in FIG. 17. As seen from FIG. 18, in a conventional semiconductor device, the metallic film 69 is deposited by sputtering. Therefore, the coating of the metallic film 69 may deteriorate and break in the recess of the metallic plug 68 (step formed between the fifth interlayer insulating film 64 and the surface of the metallic plug 68). The aspect ratio of the recess portion (ratio of the recess height to the size of the connecting hole) increases with a reduction in the size of the connecting hole so that the coating of the metallic film at the step deteriorates. Therefore, this problem becomes serious with miniaturization of the semiconductor device.

As a technique for solving the problem, for example, JP-A-7-288244 and JP-A-9-167797 disclose a technique for canceling the step (level difference) using the CMP (Chemical Mechanical Polishing) after a conductive layer has been formed. This CMP technique can reduce the recess in a method of forming a conductive plug, and hence can obviate the problem of the plug forming method by RIE (Reactive Ion Etching).

However, the above technique using the CMP additionally requires a polishing apparatus or an apparatus for cleaning a wafer after the polishing, and also presents a problem of complicating a manufacturing process that the surface of the insulating film where a connecting hole is to be formed must be flattened through the CMP.

Other techniques have been also proposed. One is to improve the coating of the metallic film by depositing it at a high temperature of 400° C. to 500° C. by sputtering (high temperature sputtering). The other is to cause the re-flow of the metallic film at a high temperature of 400° C. to 500° C. after it has been deposited by ordinary sputtering (reflow sputtering).

These techniques can dramatically improve the coating at the plug recess. However, all these techniques require for the sputtering apparatus to be modified so as to endure a high temperature, and present a problem that the film surface becomes uneven severely owing to the grain of the metallic film according to the cooling condition after a high temperature has been held and hence the production yield due to the remainder of etching deteriorates.

As a technique for reducing the plug recess without adopting the CMP, for example, JP-A-2-45934 and JP-A-8-250590 discloses a technique of etching the insulating film after the plug has been formed, thereby removing the plug recess. However, where the insulating film is etched back by the dry etching disclosed in JP-A-2-45934, F, C, O, etc. contained in the etching gas will be adsorbed onto the surface of the conductive plug to form a deteriorated film. This makes unstable the contact resistance between the plug and overlying wiring.

SUMMARY OF THE INVENTION

The present invention has been accomplished in order to solve the problems involved in the conventional semiconductor device described above and its manufacturing method. An object of the invention is to improve the step coating of a metallic film at a recess using a conventional semiconductor manufacturing apparatus without complicating the manufacturing process, thereby provide a reliable semiconductor device and its manufacturing method.

The semiconductor device according to the invention is a semiconductor device having a wiring structure including a conductive plug which passes through an insulating film on a substrate, comprising:

a first insulating film; a second insulating film formed on the first insulating film;

a conductive plug embedded within an connecting hole which passes through the first and the second insulating film;

a wiring layer formed on the second insulating film so that it is communicated with the conductive plug, wherein the conductive plug protrudes from a surface of the insulating film, and the connecting hole is shaped so that its opening has a larger diameter at its upper position.

Further, the semiconductor device according to the invention is a semiconductor device having a wiring structure including a conductive plug which passes through an insulating film on a substrate, comprising:

a first insulating film;

an etching stopper film formed on the first insulating film;

a conductive plug embedded within a first connecting hole which passes through the first insulating film and the etching stopper film;

a wiring layer formed on the etching stopper film so that it is communicated with the conductive plug, wherein the conductive plug protrudes from a surface of the etching stopper film.

Furthermore, the semiconductor device according to the invention is a semiconductor device further comprising a second insulating film formed on the etching stopper film, wherein the wiring layer is embedded with a second connecting hole and has a thickness approximately equal to that of the second insulating film.

Further, the semiconductor device according to the invention is a semiconductor device having a wiring structure including a conductive plug which passes through an insulating film on a substrate, comprising:

a first insulating film;

an etching stopper film formed on the first insulating film;

a first conductive plug embedded within a first connecting hole which passes through the first insulating film and the etching stopper film; and a second conductive plug formed in a second insulating film formed on the etching stopper film so that it is communicated with the first conductive plug, wherein the first conductive plug protrudes from a surface of the etching stopper.

Furthermore, the semiconductor device according to the invention is a semiconductor device wherein the first insulating film is an oxide film and the etching stopper film is a nitride film.

Further, the method of manufacturing a semiconductor device according to the invention is a method of manufacturing a semiconductor device having a wiring structure including a conductive plug which passes through an insulating film on a substrate, comprising the steps of:

forming a first insulating film on the substrate;

forming a second insulating film on the first insulating film;

forming a connecting hole which passes through the first and the second insulating film;

forming a conductive film within the connection hole and on a surface of the second insulating film and etching back the conductive film until the second insulating film is exposed, thereby forming a conductive plug within the connecting hole;

etching back the second insulating film by dry etching;

exposing surfaces of the second insulating layer and the conductive plug to plasma atmosphere containing oxygen, cleaning them by argon sputter etching or irradiating them with UV light so that impurities on the exposed surfaces of the second insulating film and the conductive plug are removed; and forming a wiring layer on the second insulating film so that it is communicated with the conductive plug.

Furthermore, the method of manufacturing a semiconductor device according to the invention is a method of manufacturing a semiconductor device having a wiring structure including a conductive plug which passes through an insulating film on a substrate, comprising the steps of:

forming a first insulating film on the substrate;

forming a second insulating film on the insulating film;

forming a connecting hole which passes through the first and the second insulating film;

forming a conductive film within the connection hole and on a surface of the second insulating film and etching back the conductive film until the second insulating film is exposed, thereby forming a conductive plug within the connecting hole;

etching the insulating film using an HF dilute solution; and forming a wiring layer on the second insulating film so that it is communicated with the conductive plug.

Further, the method of manufacturing a semiconductor device according to the invention is a method of manufacturing a semiconductor device having a wiring structure including a conductive plug which passes through an insulating film on a substrate, comprising the steps of:

forming a first insulating film on the substrate;

forming an etching stopper film on the first insulating film;

forming a second insulating film on the etching stopper film;

forming a connecting hole which passes through the first insulating film, the etching stopper film and the second insulating film;

forming a conductive film within the connecting hole and on a surface of the second insulating film and etching back the conductive film until the second insulating film is exposed, thereby forming a conductive plug within the connecting hole;

removing the second insulating film until a surface of the etching stopper film is exposed; and forming a wiring layer on the etching stopper film so that it is communicated with the conductive plug.

DETAILED DESCRIPTION OF THE PREFERRED EMBODIMENTS (Embodiment 1)

Figure 1:
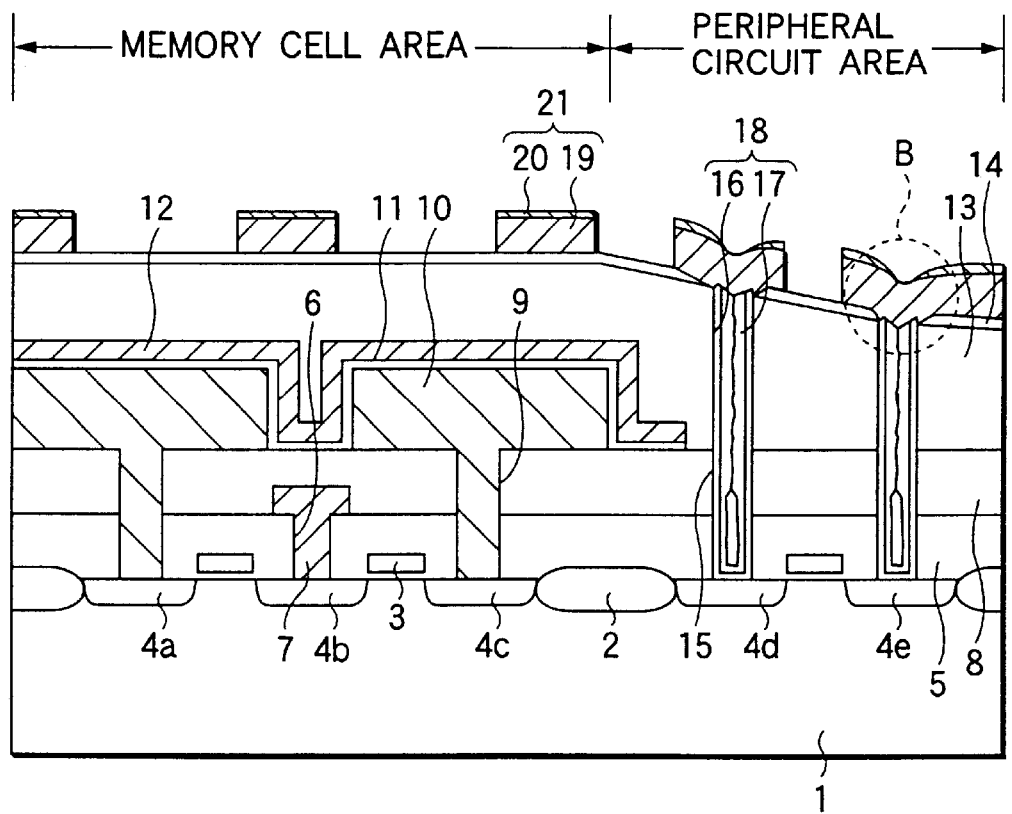
FIG. 1 is a schematic view of the sectional structure of a semiconductor device according to the first embodiment of the invention.

FIG. 1 is a sectional view showing a semiconductor device according to the first embodiment of the invention. In this embodiment, as seen from FIG. 1, in a memory cell area, an element isolation insulating film 2 is formed on the surface of a semiconductor substrate 1. On the surface of the semiconductor substrate 1 encircled by the element isolation insulating film 2, source/drain regions 4a–4e are formed. In FIG. 1, reference numeral 3 denotes a gate electrode; 5 denotes a first interlayer insulating film formed on the semiconductor substrate 1; 6 denotes a first connecting hole of a bit line contact which passes the first interlayer insulating film 5 to reach the source/drain region 4a–4e of a transistor; 7 denotes a first wiring layer of a bit line which is formed within the connecting hole 6 and on the surface of the first interlayer insulating film 5 ; 8 denotes a second interlayer insulating film which covers the surface of the first wiring layer 7 and the first interlayer insulating film 5.

Reference numeral 9 denotes a second connecting hole which is a storage node contact; 10 denotes a storage node of e.g. polysilicon; 11 denotes a third insulating film which is an insulating film for a capacitor element; and 12 denotes a cell plate. The storage node 10, third insulating film 11 and cell plate 12 constitute the capacitor element.

Reference numeral 13 denotes a fourth interlayer insulating film for covering the surface of the capacitor element and second interlayer insulating film 8. The fourth interlayer insulting film 13 is made of an oxide film of e.g. BPSG. Reference numeral 14 denotes a fifth interlayer insulating film for protecting the surface of the fourth interlayer insulating film 13 and improving contact with a resist pattern. The fifth interlayer insulating film 14 may be an oxide film formed by plasma CVD using e.g. TEOS and $O_3$, inorganic SOG film, BPSG and other oxide films. Reference numeral 15 denotes a third connecting hole which passes through the fifth interlayer insulating film 14, fourth interlayer insulating film 13, second interlayer insulating film 8 and first interlayer insulating film 5 in a peripheral circuit area to reach the source/drain region 4d, 4e of the transistor.

Reference numerals 16 and 17 denote a first and a second refractory metallic layer made of e.g. Ti or W or its nitride, silicide, etc., respectively. Reference numeral 18 denotes a metallic plug formed within the third connecting hole 15 which reaches the source/drain region 4d, 4e of the transistor. Reference numeral 19 denotes a metallic film made of an aluminum alloy such as AlSi, AlSiCu, AlCu, etc. Reference numeral 20 is an antireflective film made of a refractory metal such as TiN, Wsi, MoSi, TiW, W, etc. Reference numeral 21 denotes a second wiring layer.

Figure 2:
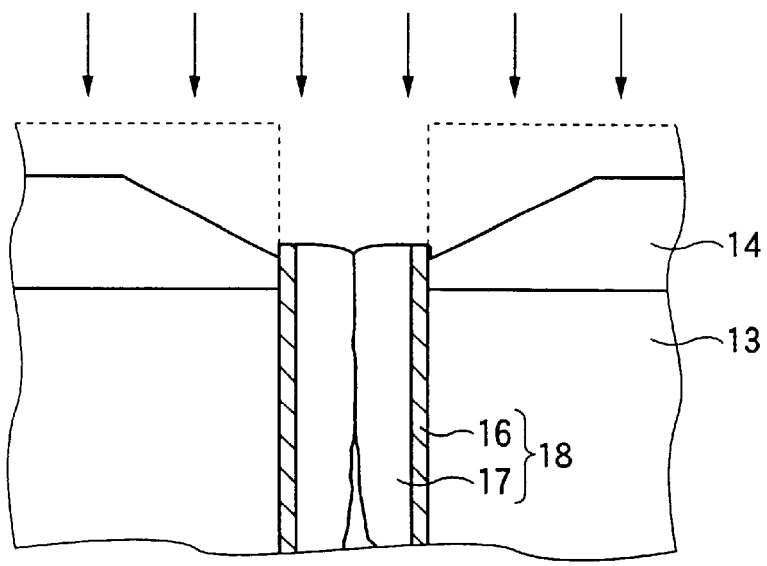
FIG. 2 is a sectional structural view for explaining the manufacturing process of a semiconductor device according to the first embodiment of the invention.
Figure 3:
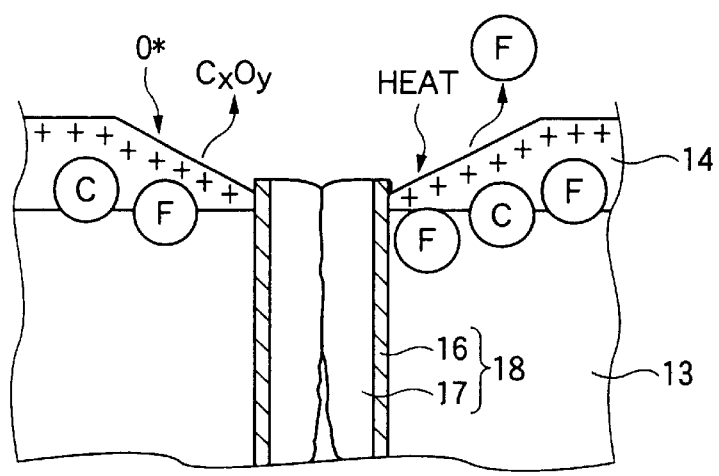
FIG. 3 is a sectional structural view for explaining the manufacturing process of a semiconductor device according to the first embodiment of the invention.
Figure 4:
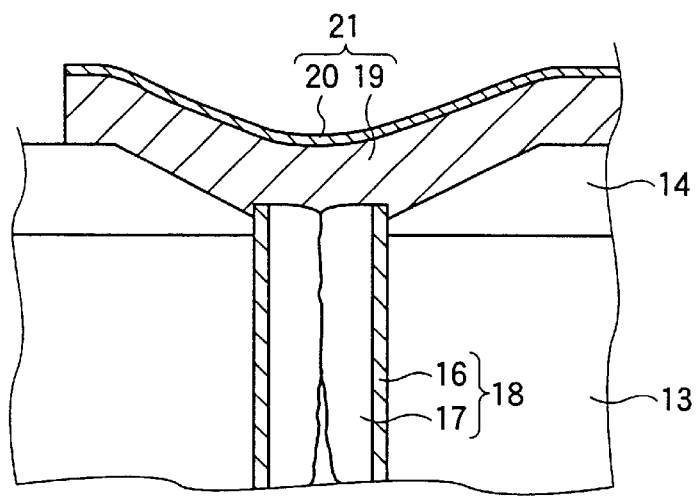
FIG. 4 is a sectional structural view for explaining the manufacturing process of a semiconductor device according to the first embodiment of the invention.

FIGS. 2 to 4 are schematic sectional views for explaining a method of manufacturing a semiconductor device according to the first embodiment of the invention, and particularly, enlarged views of a part "B" that is the vicinity of the top of the third connecting hole 15. The manufacturing process until the structure as shown in FIG. 2 is obtained, which is the same as that in the conventional technique, will not be explained here.

As shown in FIG. 2, after the metallic plug 18 has been embedded in the connecting hole 15 by the same process as the conventional technique, the exposed surfaces of the fifth interlayer insulating film 14 and metallic plug 18 are etched back by dry etching in an atmosphere containing CF4. Thus, the step height created between the surfaces of the metallic plug 18 and the fifth interlayer insulating film 14 is reduced. In addition, the shape of the connecting hole 15 is shaped so that its opening has a larger diameter at its upper position. After this step, the metallic layer 19 is formed as an overlying layer by sputtering.

This solves the problem of degradation and poor connection of the metallic film 19 at the recess. The etch-back treatment by the dry etching uses e.g. a mixed gas of e.g. $CF_4/O_2/Ar$ or $CHF_3/CF_4/Ar$. In the etching treatment for the $SiO_2$ film using the mixed gas of $CF_4/O_2/Ar$ or $CHF_3/CF_4/Ar$, since the etching rate for the metallic film 18 is relatively sufficiently low, the surface step (recess) between metallic plug 18 embedded in the connecting hole 15 and the interlayer insulating film 14 decreases with an increase in the quantity of etch-back. Further, with an increase in the quantity of etch-back, shaping of the connecting hole 15 advances so that its opening has a larger diameter at its upper position. This shaping can be sufficiently realized by the etch-back of several tens nm (nanometer) to several hundreds nm in terms of the thickness of the insulating film.

As seen from FIG. 3, the surface of the fifth interlayer insulating film 14 and the metallic plug 18 is exposed to the plasma atmosphere containing oxygen, irradiated with light having a wavelength of several tens 10 nm to 400 nm or subjected to the sputter etching treatment using Ar gas. As shown in FIG. 4, the second wiring layer 21 consisting of the metallic film 19 and the anti-reflective film 20 is formed.

In the step shown in FIG. 2, during the etch-back by dry etching in an atmosphere containing $CF_4$ gas, C (carbon) or F(fluorine) contained in the atmosphere of dry etching is adsorbed on the exposed surface of the fifth interlayer insulating film 14 and the metallic plug 18. A thin layer with C and F adsorbed is formed on the surface of the fifth interlayer insulating film 14. Therefore, when the second wiring layer 21 is formed, its contact with the fifth interlayer insulting film 14 is not sufficient. Thus, when the heat treatment at a temperature of 300° C. to 800° C. is made in a later step of the process of manufacturing a semiconductor device, a wiring pattern may exfoliate due to possible thermal stress.

In order to obviate such inconvenience, C (carbon) adsorbed on the surface of the fifth interlayer insulating film 14 after the etch-back is removed by combining it with O (oxygen) by the oxygen radical in the oxygen plasma so that it is made gaseous. Otherwise, carbon can be also removed by irradiating the surface with the light having a wavelength of several tens nm to 400 nm so that generated $O_3$ is combined with O (oxygen). The fluorine adsorbed on the surface is cooled so that it is removed into the gas atmosphere.

The sputter etching using the Ar gas permits the carbon and fluorine adsorbed on the surface of the fifth interlayer insulating film 14 and the metallic plug 18 to be etched away simultaneously with the oxide film and metallic film. Where a surface step (plug recess) is present between the metallic plug 18 and interlayer insulating film 14, during the sputter etching, the sputtered particles of the reduced interlayer insulating film may be deposited on the plug surface again so that the contact resistance between the metallic plug 18 and the second metallic wiring 21 increases or poor contact occurs. However, in this embodiment, since the plug recess has been removed, the sputtered particles will not be deposited again on the plug surface so that the contact resistance does not increase and the poor contact does not occur. This provides a reliable semiconductor device. Further, since the metallic plug 18 protrudes from the surface of the fifth interlayer insulating film 14, the contact area between the metallic plug 18 and the second wiring 21 increases, thereby making an improvement in the electric characteristic such as reduction in the resistance or improvement in the electromigration life.

(Embodiment 2)

Figure 5:
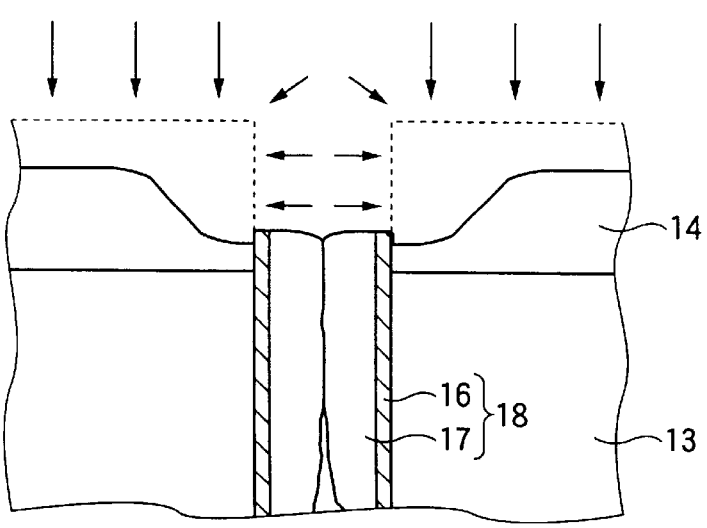
FIG. 5 is a sectional structural view for explaining the manufacturing process of a semiconductor device according to the second embodiment of the invention.
Figure 6:
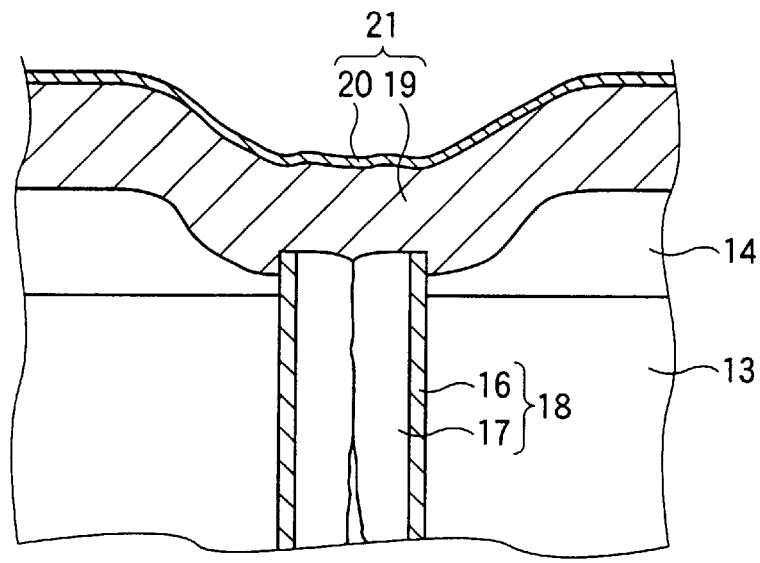
FIG. 6 is a sectional structural view for explaining the manufacturing process of a semiconductor device according to the second embodiment of the invention.

FIGS. 5 and 6 are schematic sectional views for explaining a method of manufacturing a semiconductor device according to the first embodiment of the invention, and particularly, enlarged views of the vicinity of the top of the third connecting hole. The manufacturing process until the structure as shown in FIG. 5 is obtained, which is the same as that in the first embodiment, will not be explained here.

As shown in FIG. 5, using e.g. an HF dilute solution, the surface of the fifth interlayer insulating film 14 is etched back so that the recess of the metallic plug can be reduced and the shape of the top of the connecting hole can be improved. During the wet etching using the HF dilute solution, the etching advances isotropically so that the aspect ratio when the metallic film 19 is formed by sputtering decreases in the vicinity of the top of the metallic plug 18. Therefore, as shown in FIG. 6, the coating of the metallic film 19 can be improved. Further, since the metallic plug 18 protrudes from the surface of the fifth interlayer insulating film 14 as shown in FIG. 5, the contact area between the metallic plug 18 and the second wiring 21 increases, thereby making an improvement in the electric characteristic such as reduction in the resistance or improvement in the electromigration life.

Unlike the first embodiment, in this embodiment, the dry etching using $CF_4$ as the etch-back treatment is not carried out to reduce the step. Therefore, a derivative problem that C and F adsorbed on the surface of the fifth interlayer insulating film 14 and the metallic plug 18 degrades the contact with the second wiring 21 does not occur.

(Embodiment 3)

Figure 7:
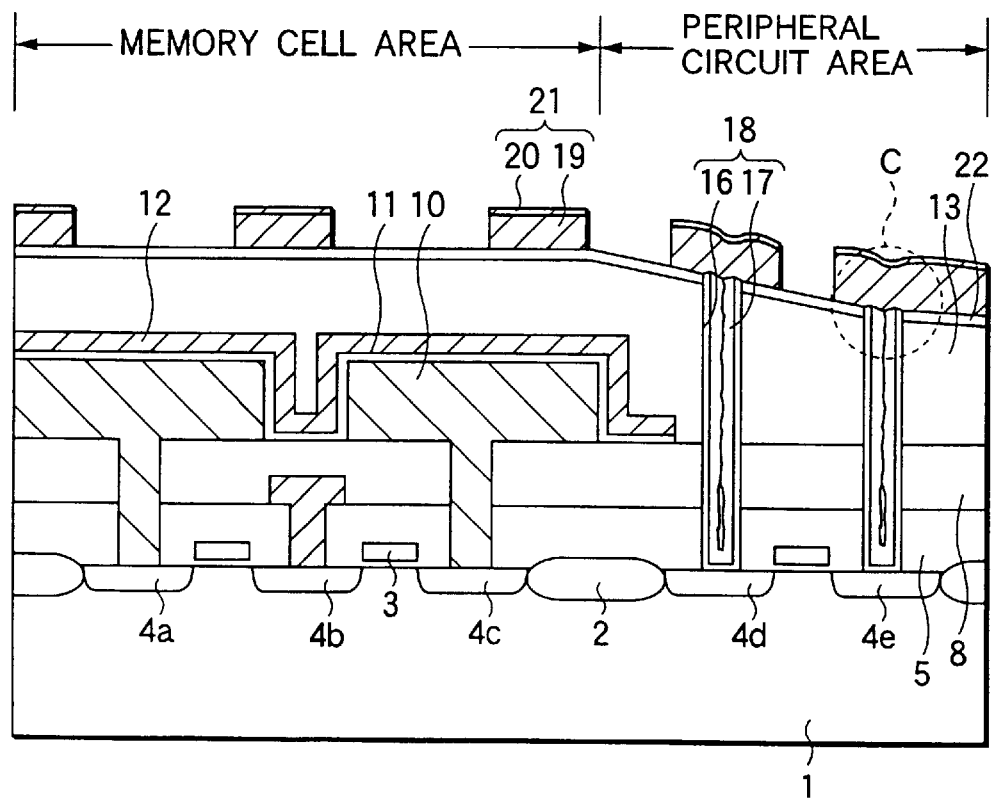
FIG. 7 is a schematic view of the sectional structure of a semiconductor device according to the third embodiment of the invention.
Figure 8:
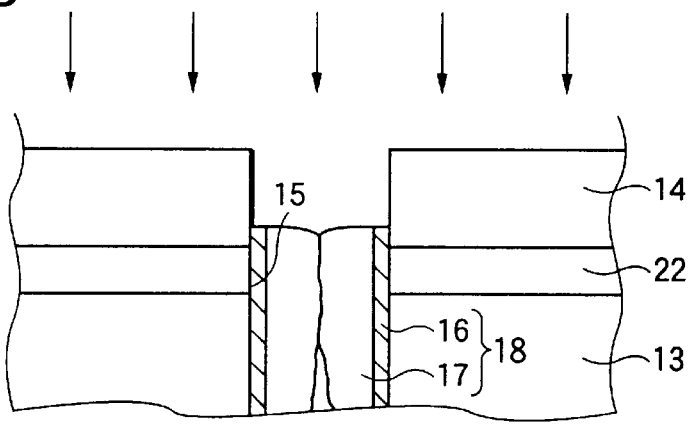
FIG. 8 is a sectional structural view for explaining the manufacturing process of a semiconductor device according to the third embodiment of the invention.
Figure 9:
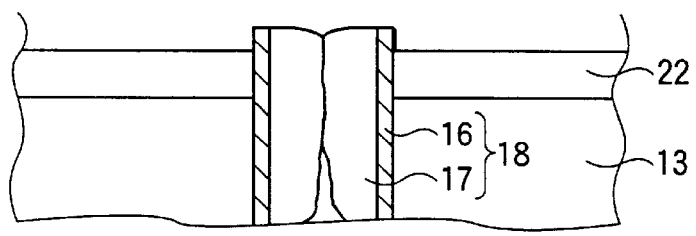
FIG. 9 is a sectional structural view for explaining the manufacturing process of a semiconductor device according to the third embodiment of the invention.

FIG. 7 is a sectional view showing a semiconductor device according to the third embodiment of the invention. FIGS. 8 to 9 are schematic sectional views for explaining a method of manufacturing a semiconductor device shown in FIG. 7, and particularly, enlarged views of a part "C" that is the vicinity of the top of the third connecting hole 15. In FIG. 7, the manufacturing process until the fourth interlayer insulating film 13 is formed is the same as that in the first embodiment.

After the fourth interlayer insulating film 13 had been formed, as seen from FIG. 8, a six interlayer insulating film 22 that exhibits an smaller etching rate than that of the fifth interlayer insulating film during the etch-back of the fifth interlayer insulating film 14 is previously formed. Thereafter, the fifth interlayer insulating film 14 is formed. Further, by means of the photolithograph and dry etching, the connecting hole 15 which passes through the fourth, sixth and fourth interlayer insulating film is formed. As in the first embodiment, the connecting hole 15 is filled with the first refractory metallic film 16 and the second refractory metallic film 17. Thereafter, metallic plug 18 is formed within the third connecting hole 15 through the etch-back treatment by the RIE technique. In this case, the metallic plug 18 is over-etched to create a step (recess) between the fifth interlayer insulating film 14 and the metallic plug 18.

As shown in FIG. 9, the fifth interlayer insulating film 14 is etched away to expose the six interlayer insulating film 22. In this case, only the fifth interlayer insulating film 14 is selectively etched away under the condition that the metallic plug 18 and sixth interlayer insulating film 22 are not etched.

If the thickness of the fifth interlayer insulating film 14 is set at a value equal to the quantity of recess, the recess of the metallic plug 18 can be canceled after the fifth interlayer insulating film 14 has been removed. Otherwise, if the etching quantity is set at a larger value than the quantity of recess, the metallic plug 18 can be caused to protrude from the surface of the six interlayer insulating film 22 after the fifth interlayer insulating film 14 has been removed.

The controllability of a manufacturing process is preferably improved by selecting the materials of the fifth interlayer insulating film 14 and the sixth interlayer insulating film 22 so that the former has a larger etching rate than that of the latter. To this end, the fifth interlayer insulating film 14 may be an SiO film that can be formed by the plasma CVD using e.g. TEOS and $O_3$, and the sixth interlayer insulating film 22 may be a nitride film that can be formed by the reduced-pressure thermal CVD. The fifth interlayer insulating film 14 having a large etching rate for the HF dilute solution may be also an inorganic SOG film containing no organic component in a dissolved substance or an oxide film containing B or P that can be created by the CVD.

Thereafter, as seen from FIG. 7, the metallic film 19 and antireflective film 20 are formed by the sputtering. By means of the photolithography and the etching, the second wiring layer 21 is formed.

The etched quantity may change during the etch-back of the fifth interlayer insulating layer 14 so that the coating of the metallic film above the metallic plug 18 also changes.

However, as described above, according to this embodiment, since the sixth interlayer insulating film 22 serving as a stopper layer during etching is formed below the fifth interlayer insulating film 14, such a unstable factor can be cancelled, thereby providing a semiconductor device with improved stability and reproducibility.

(Embodiment 4)

Figure 10:
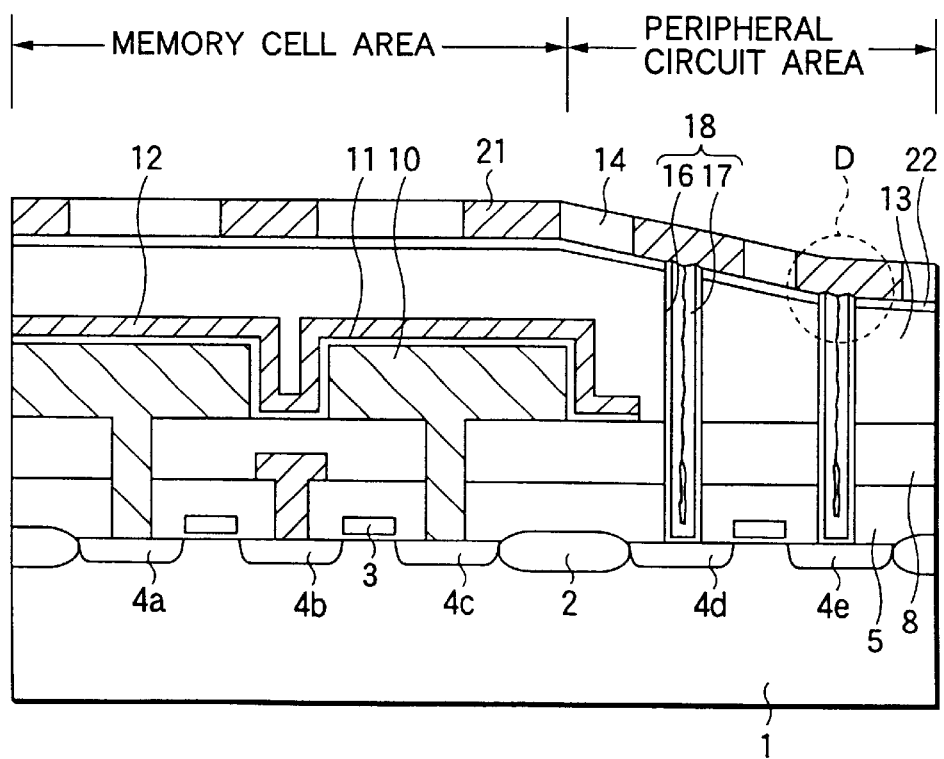
FIG. 10 is a schematic view of the sectional structure of a semiconductor device according to the fourth embodiment of the invention.
Figure 11A:
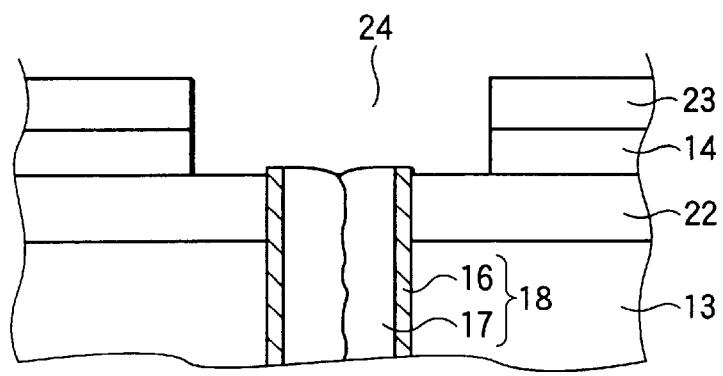
FIGS. 11A and 11B are sectional structural views for explaining the manufacturing process of a semiconductor device according to the fourth embodiment of the invention.
Figure 11B:
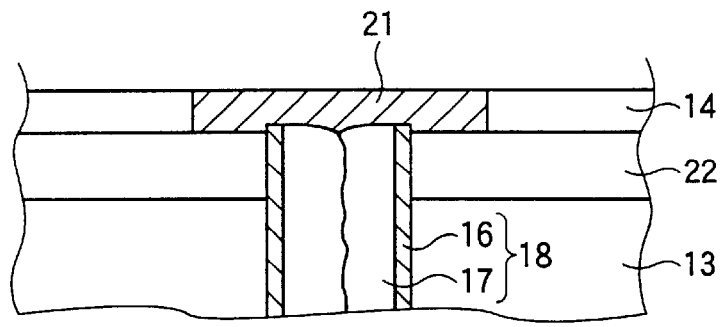

FIG. 10 is a sectional view showing a semiconductor device according to the fourth embodiment of the invention. FIGS. 11A and 11B are schematic sectional enlarged views of a part "D" that is the vicinity of the top of the third connecting hole 15. In this embodiment, as in the third embodiment, the fourth interlayer insulating film 13, sixth interlayer insulating film 22 and fifth interlayer insulating film 14 are formed to make the third connecting hole 15; the first refractory metallic layer 16 and second refractory metallic layer 17 are formed; and through the etch-back treatment by the RIE technique, the metallic plug 18 is formed within the third connecting hole 15.

Subsequently, referring to FIG. 11A, a resist film is deposited to cover the fifth interlayer insulating film 14 and metallic plug 18, and a resist pattern 23 for wiring formation is formed by the photolithography. Using the resist pattern 23 as a mask, the fifth interlayer insulating film 14 is anisotropically etched to form a groove pattern 24 for wiring formation. Since the sixth interlayer insulating film 22 serves as an etching stopper when the fifth interlayer insulating film 14 is etched to form the groove pattern 24, the etching ends at the surface of the sixth interlayer insulating film 22. For this reason, the thickness of the second wiring layer 21 to be formed later can be set at a value equal to that of the fifth interlayer insulating film 14.

Referring to FIG. 11B, the second wiring layer 21 of a metallic film is formed so as to fill the groove pattern 24 for wiring formation. The second wiring layer 21 on the surface of the fifth interlayer insulating film 14 is etched back by the RIE technique so that the second wiring layer 21 of the metallic film is left only within the inside of the groove pattern 24 for wiring formation, thereby providing the second wiring layer 21 embedded in the fifth interlayer insulating film 14.

In this way, in accordance with this embodiment, the recess of the metallic plug 13 can be cancelled and the overlying wiring is also embedded in the fifth interlayer insulating film 14.

This removes necessity of coating the step by the metallic film and also removes the unevenness of the overlying wiring, thereby facilitating realization of a multi-wiring structure.

(Embodiment 5)

Figure 12:
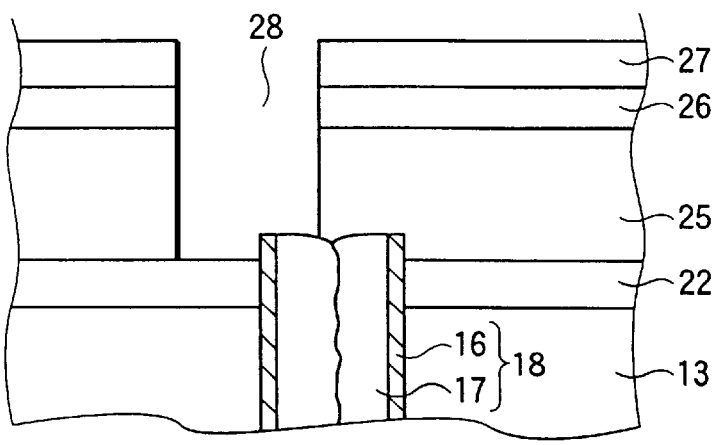
FIG. 12 is a sectional structural view for explaining the manufacturing process of a semiconductor device according to the fifth embodiment of the invention.

FIG. 12 is a sectional view showing the method of manufacturing a semiconductor device according to the fifth embodiment of the invention, i.e. an enlarged view of the vicinity of the top of the third connecting hole 15. The manufacturing process until the structure shown in FIG. 12 is obtained, which is the same as that until the structure shown in FIG. 9 is obtained in the third embodiment, is not be explained here.

Referring to FIG. 12, a seventh interlayer insulating film 25, eighth interlayer insulating film 26 and ninth interlayer insulating film 27 are formed so as to cover the sixth interlayer insulating film 22 and metallic plug 18. Using a resist pattern (not shown) as a mask, photolithography and etching are carried out to form a fourth connecting hole 28 which passes through the seventh interlayer insulating film 25, eighth interlayer insulating film 26 and ninth interlayer insulating film 27. The fourth connecting hole 28 is formed when the etching is stopped by the sixth interlayer insulating film 22 or metallic plug 18.

Figure 13:
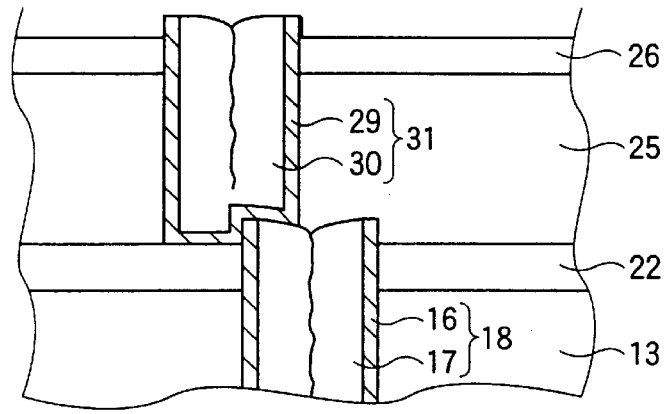
FIG. 13 is a sectional structural view for explaining the manufacturing process of a semiconductor device according to the fifth embodiment of the invention.
Figure 14:
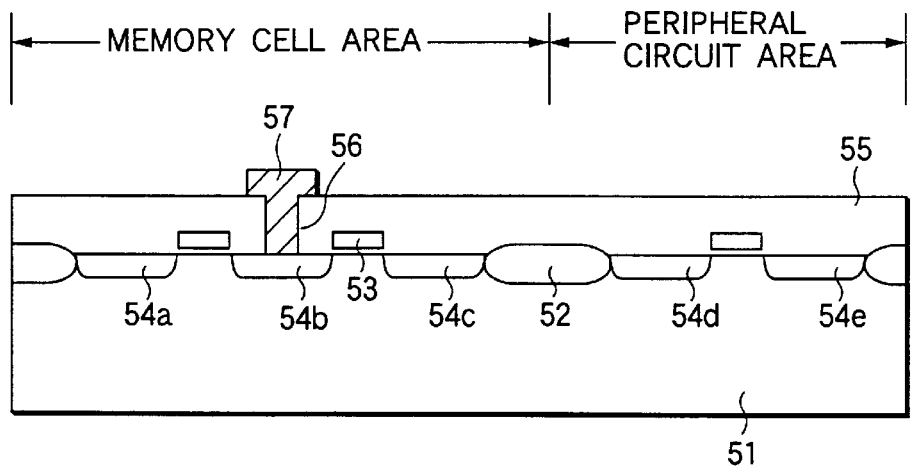
FIG. 14 is a sectional structural view for explaining a conventional manufacturing method of a semiconductor device.
Figure 15:
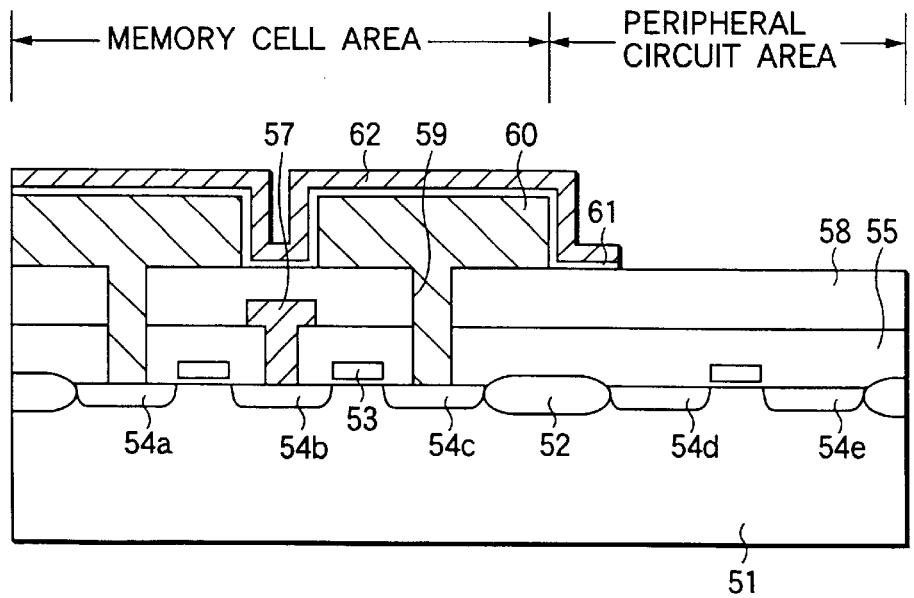
FIG. 15 is a sectional structural view for explaining a conventional manufacturing method of a semiconductor device.
Figure 16:
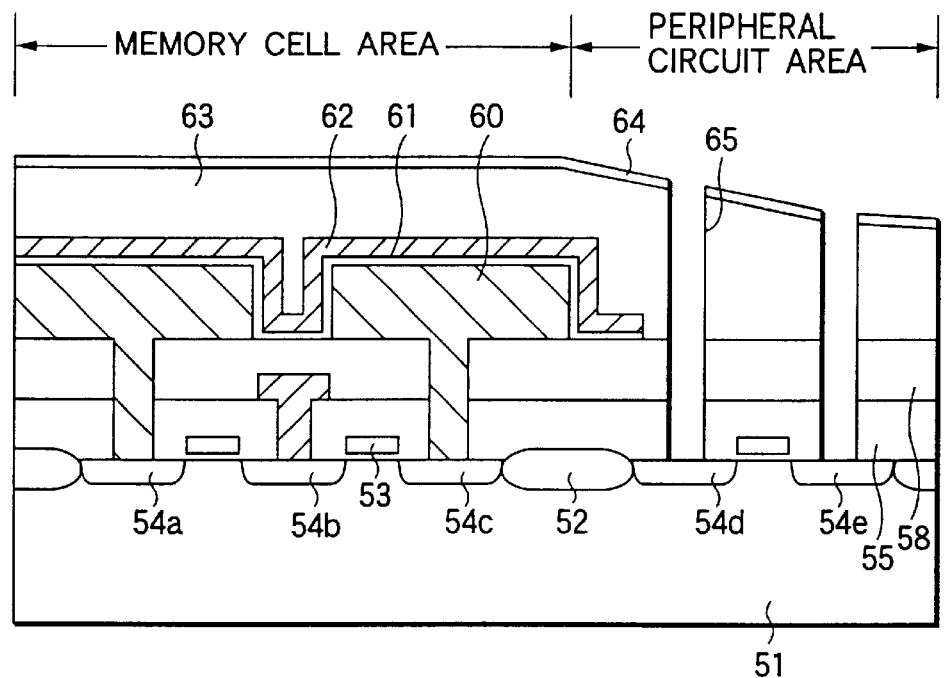
FIG. 16 is a sectional structural view for explaining a conventional manufacturing method of a semiconductor device.
Figure 17:
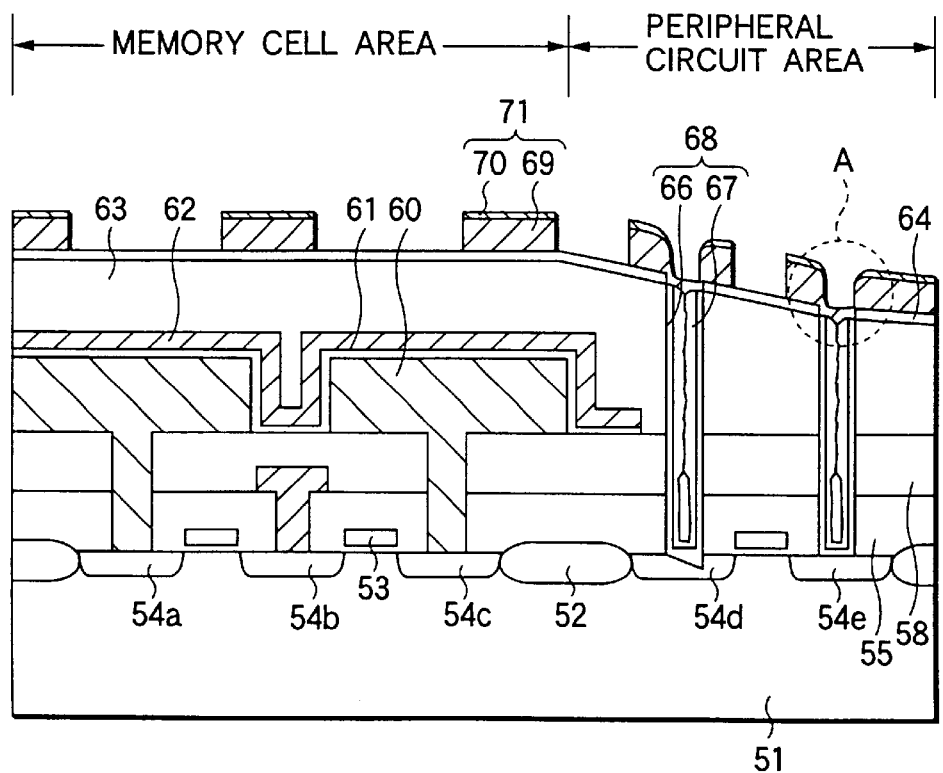
FIG. 17 is a schematic view showing the sectional structure of a conventional semiconductor device.
Figure 18:
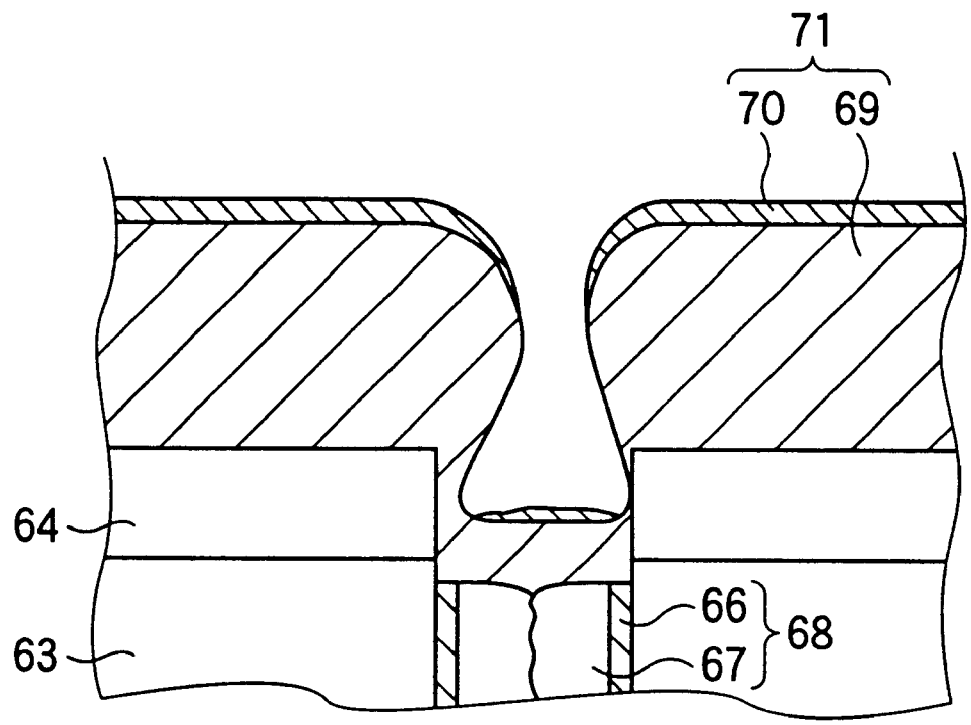
FIG. 18 is an enlarged schematic view of a portion "A" in FIG. 17.

Referring to FIG. 13, after the resist pattern has been removed, a third metallic film 29 and a fourth metallic film 30 are formed on the surface of the ninth interlayer insulating film 27 and within the fourth connecting hole 28. The third metallic film 29 and fourth metallic film 30 thus formed are etched back to form a metallic plug 30 within the connecting hole 28. The ninth interlayer insulating film 27 is etched away to expose the eighth interlayer insulating film 26. In this case, only the ninth interlayer insulating film 27 is selectively etched away under the condition that the metallic plug 31 and eighth interlayer insulating film 26 are not etched.

In the manufacturing method according to the fifth embodiment in which the metallic plugs 18 and 31 are stacked, since the metallic plug 18 is previously formed so as to protrude from the surface of the eighth insulating film 22, the overlying metallic plug 31 is electrically connected to the upper wall and side wall of the underlying metallic plug 28. This reduces and stabilizes the electric resistance. Further, since the metallic plugs 18 and 31 are directly connected to each other, as shown in FIG. 13, the wiring layout can be reduced as compared with the case where they are connected through a metallic wiring layer, thereby reducing the chip size.

As understood from the description hitherto made, in accordance with the semiconductor device according to the invention, the conductive plug protrudes from a surface of the insulating film, and the connecting hole is shaped so that its opening has a large diameter at its upper position.

For this reason, the coating of the wiring layer formed on the plug is improved and the reliability of the semiconductor device can be improved. The contact area between the wiring layer and the conductive plug is increased to improve the electric characteristic such as reduction in the electric resistance.

Since the conductive plug has a shape protruding from a surface of the etching stopper film, the contact area between the wiring layer and the conductive plug is increased to improve the electric characteristic such as reduction in the electric resistance.

Further, the semiconductor device according to the invention comprises a second insulating film formed on the etching stopper film, and the wiring layer is embedded with a second connecting hole and has a thickness approximately equal to that of the second insulating film. In this configuration, the wiring layer is embedded with a second connecting hole so that the unevenness of the overlying wiring is removed, thereby facilitating realization of a multi-wiring structure.

The semiconductor device according to the invention is a semiconductor device having a wiring structure including a conductive plug which passes through an insulating film on a substrate, comprising: a first insulating film; an etching stopper film formed on the first insulating film; a first conductive plug embedded within a first connecting hole which passes through the first insulating film and the etching stopper film; and a second conductive plug formed in a second insulating film formed on the etching stopper film so that it is communicated with the first conductive plug, wherein the first conductive plug protrudes from a surface of the etching stopper.

In this configuration, the protruding conductive plugs are stacked so that they can be directly connected to each other not through a wiring layer. This contributes to the wiring at a high density.

In the semiconductor device according to the invention, since the first insulating film is an oxide film and the etching stopper film is a nitride film, the etching can be easily controlled.

The method of manufacturing a semiconductor device according to the invention is a method of manufacturing a semiconductor device having a wiring structure including a conductive plug which passes through an insulating film on a substrate, comprising the steps of: forming a first insulating film on the substrate; forming a second insulating film on the first insulating film; forming a connecting hole which passes through the first and the second insulating film; forming a conductive film within the connection hole and on a surface of the second insulating film and etching back the conductive film until the second insulating film is exposed, thereby forming a conductive plug within the connecting hole; etching back the insulating film by dry etching; exposing surfaces of the second insulating layer and the conductive plug to plasma atmosphere containing oxygen, cleaning them by argon sputter etching or irradiating them with UV light so that impurities on the exposed surfaces of the second insulating film and the conductive plug are removed; and forming a wiring layer on the second insulating film so that it is communicated with the conductive plug.

In this method, the recess between the conductive plug and the second insulating film can be cancelled. In addition, during the etch-back of the second insulating film by dry etching, the impurities adsorbed on the surfaces of the second insulating film and conductive plug can be removed, thereby improving the contact of their contact with the wiring layer.

The method of manufacturing a semiconductor device according to the invention is a method of manufacturing a semiconductor device having a wiring structure including a conductive plug which passes through an insulating film on a substrate, comprising the steps of: forming a first insulating film on the substrate; forming a second insulating film on the insulating film; forming a connecting hole which passes through the first and the second insulating film; forming a conductive film within the connection hole and on a surface of the second insulating film and etching back the conductive film until the second insulating film is exposed, thereby forming a conductive plug within the connecting hole; etching the insulating film using an HF dilute solution; and forming a wiring layer on the second insulating film so that it is communicated with the conductive plug.

In this method, the recess between the conductive plug and the second insulating film can be cancelled.

The method of manufacturing a semiconductor device according to the invention is a method of manufacturing a semiconductor device having a wiring structure including a conductive plug which passes through an insulating film on a substrate, comprising the steps of: forming a first insulating film on the substrate; forming an etching stopper film on the first insulating film; forming a second insulating film on the etching stopper film; forming a connecting hole which passes through the first insulating film, the etching stopper film and the second insulating film; forming a conductive film within the connection hole and on a surface of the second insulating film and etching back the conductive film until the second insulating film is exposed, thereby forming a conductive plug within the connecting hole; removing the second insulating film until a surface of the etching stopper film is exposed; and forming a wiring layer on the etching stopper film so that it is communicated with the conductive plug.

In this method, since the etching stopper region is provided, the controllability of the etch-back amount of the second insulating film can be improved.

What is claimed is:

1. A semiconductor device having a wiring structure including a conductive plug which passes through an insulating film on a substrate, said semiconductor device comprising:
   a first insulating film;
   a second insulating film formed on said first insulating film;
   a conductive plug embedded within an connecting hole which passes through said first and said second insulating film;
   a wiring layer formed on said second insulating film so as to be communicated with said conductive plug, wherein said conductive plug protrudes from a surface of said second insulating film which is located directly under said wiring layer connected to said conductive plug at the uppermost portion of said connecting hole, and said connective hole is shaped so that opening thereof has a larger diameter at upper position thereof.

2. A semiconductor device having a memory cell area containing a capacitor and a peripheral circuit area with a step formed therebetween, and wiring structure including a conductive plug which passes through an insulating film on a substrate, said semiconductor device comprising:

a first insulating film over the capacitor;

an etching stopper film formed on said first insulating film;

a conductive plug embedded within a first connecting hole which passes through said first insulating film and said etching stopper film in the peripheral circuit area;

a wiring layer formed on said etching stopper film so as to be communicated with said conductive plug, wherein said conductive plug protrudes from a surface of said etching stopper film.

3. The semiconductor device according to claim 2, further comprising:

a second insulating film formed on said etching stopper film, wherein said wiring layer is embedded with a second connecting hole and has a thickness approximately equal to that of said second insulating film.

4. A semiconductor device having a memory cell area containing a capacitor and a peripheral circuit area with a step formed therebetween, and wiring structure including a conductive plug which passes through an insulating film on a substrate, said semiconductor device comprising:

a first insulating film over the capacitor;

an etching stopper film formed on said first insulating film;

a first conductive plug embedded within a first connecting hole which passes through said first insulating film and said etching stopper film in the peripheral circuit area; and a second conductive plug formed in a second insulating film formed on said etching stopper film so as to be communication with said first conductive plug, wherein said first conductive plug protrudes from a surface of said etching stopper.

5. The semiconductor device according to claim 2, wherein said first insulating film is an oxide film, and said etching stopper film is a nitride film.

6. The semiconductor device according to claim 4, wherein said first insulating film is an oxide film, and said etching stopper film is a nitride film.

* * * * *